United States Patent [19]

Sandock

[11] Patent Number: 5,516,545
[45] Date of Patent: May 14, 1996

[54] COATING PROCESSES AND APPARATUS

[76] Inventor: Leonard R. Sandock, 140 Upton Rd., Westboro, Mass. 01581

[21] Appl. No.: 675,320

[22] Filed: Mar. 26, 1991

[51] Int. Cl.$^6$ ........................................ B05D 5/12
[52] U.S. Cl. ................. 427/76; 427/209; 427/294; 427/411; 427/420; 427/424
[58] Field of Search ............ 427/96, 294, 209, 427/420, 424; 118/411

[56] References Cited

U.S. PATENT DOCUMENTS

| | | | |
|---|---|---|---|
| 3,357,856 | 12/1967 | Ragan | 427/294 |
| 3,526,535 | 9/1970 | Plumat | 117/120 |
| 3,595,204 | 7/1971 | McIntyre et al. | 239/70 |
| 3,873,500 | 3/1975 | Kato | 427/96 |
| 3,928,679 | 12/1975 | Jackson et al. | 427/402 |
| 4,050,410 | 9/1977 | Stroszynski | 118/410 |
| 4,143,190 | 3/1979 | Choinski | 427/420 |
| 4,154,879 | 5/1979 | Choinski | 427/402 |
| 4,230,793 | 10/1980 | Losert et al. | 430/315 |
| 4,313,974 | 2/1982 | Greve | 427/209 |
| 4,343,013 | 8/1982 | Bader | 346/75 |
| 4,362,122 | 12/1982 | Choinski | 118/600 |
| 4,416,214 | 11/1983 | Tanaka | 118/411 |
| 4,452,826 | 6/1984 | Shields | 427/96 |
| 4,466,378 | 8/1984 | Rogers et al. | 118/411 |
| 4,476,165 | 10/1984 | McIntyre | 427/258 |
| 4,489,671 | 12/1984 | Choinski | 118/412 |
| 4,493,857 | 1/1985 | Knigge et al. | 427/96 |
| 4,544,623 | 10/1985 | Audykowski et al. | 430/280 |
| 4,558,388 | 12/1985 | Graves | 427/294 |
| 4,560,590 | 12/1985 | Bok | 427/294 |
| 4,565,217 | 1/1986 | McIntyre | 137/625.5 |
| 4,597,719 | 7/1986 | Tano . | |
| 4,666,821 | 5/1987 | Hein | 427/96 |
| 4,687,137 | 8/1987 | Boger et al. | 230/124 |
| 4,696,885 | 9/1987 | Vijan | 430/311 |
| 4,700,474 | 10/1987 | Choinski | 29/846 |
| 4,798,163 | 1/1989 | Claasen | 118/410 |
| 4,871,584 | 10/1989 | Weber | 427/96 |
| 4,871,593 | 10/1989 | McIntyre | 427/428 |
| 4,891,249 | 1/1990 | McIntyre | 427/421 |
| 4,891,294 | 1/1990 | Noguchi | 430/110 |
| 4,938,994 | 7/1990 | Choinski | 427/96 |
| 4,943,508 | 7/1990 | Yu | 430/129 |

FOREIGN PATENT DOCUMENTS

| | | | |
|---|---|---|---|
| 0082585 | 6/1983 | European Pat. Off. . | |
| 99426 | 2/1984 | European Pat. Off. | 427/96 |
| 2175278 | 11/1986 | United Kingdom . | |
| WOA8400344 | 2/1984 | WIPO . | |

OTHER PUBLICATIONS

W. L. McCabe et al. "Unit Operations of Chemical Engineering" McGraw-Hill Co. 2nd ed. 1967, pp. 22, 88, 89, 103–105, 109, 110.
Gessner G. Hawley "The Condensed Chemical Dictionary" Van Nostrand Reinhold Company,1971 p. 930.
Abstract of Japan patent JB61049422, Jul. 22, 1986.
E. Choinski, Circuits Manufacturing, pp. 27–31 (May 1988).

*Primary Examiner*—Shrive Beck
*Assistant Examiner*—Benjamin L. Utech

[57] ABSTRACT

Processes and apparatus for uniformly coating discrete substrates by application of a controlled volume of fluid per unit surface area of a substrate. In one aspect, the invention provides a process comprising providing a fluid reservoir; and flowing fluid from the fluid reservoir without substantial interruption through one or more fluid applicators, the fluid applied with a controlled volume per unit surface area of the substrate, said fluid flow from the reservoir commencing and terminating to provide a fluid layer up to the perimeter of the substrate. The invention also provides fluid application apparatus which enable application of a uniform fluid layer, including apparatus that provides termination of fluid flow without fluid dripping or trailing of fluid.

45 Claims, 2 Drawing Sheets

COATING PROCESSES AND APPARATUS

BACKGROUND OF THE INVENTION

1. Field of the Invention

The present invention relates to coating processes and apparatus and, more specifically, processes and apparatus for uniformly coating discrete substrates by application of a controlled volume of fluid per unit surface area of a substrate. The invention is useful for a wide variety of applications including the manufacture of electronic printed circuit boards, liquid crystal displays and electronic integrated circuits.

2. Background Art

Application of a fluid coating onto a substrate is a necessary process in the manufacture of a wide variety of items. For example, a photoresist composition is applied to a substrate to fabricate printed circuit boards, liquid crystal displays, integrated circuits and other products. A typical liquid-type photoresist composition comprises a photosensitive compound or a photoinitiator dissolved or suspended in an organic solvent composition. After application to a substrate and evaporation of any solvent carrier, the photoresist is selectively exposed through use of a photomask and actinic radiation. The photomask provides areas that are selectively opaque and transparent to the radiation, and thereby defines and transfers a pattern to the photoresist coating layer. The patterned resist is then developed, for example by application of a developer solution. After development of the resist coating, the patterned substrate surface may be selectively processed, such as chemically milled, plated or coated. See, generally, Coombs, *Printed Circuits Handbook,* ch. 11 (McGraw Hill, 3d ed. 1988), incorporated herein by reference. Chemical milling is performed by application of a suitable etchant solution. The etchant solution degrades only those portions of the substrate surface bared of photoresist. Similarly, the substrate can be treated with a suitable plating solution to deposit metal only on those surface areas bared of photoresist.

Other processes require application of a solder resist (soldermask) composition. In the manufacture of a printed circuit board, a solder resist functions to restrict solder deposit or flow to only those areas of a printed circuit board that are not covered by the resist. Providing a uniform coating layer can be challenging as the resist is typically applied after the board surface has been built up in a non-uniform fashion, for example, after fabrication of board circuitry. Applying a uniform coating layer across such an irregular surface is generally a difficult process.

Many coating processes, for instance spray coating and curtain coating, apply an excess of fluid to a substrate surface. See, for example, U.S. Pat. Nos. 4,544,623 and 4,143,190, incorporated herein by reference. Application of excess fluid results in waste as well as requiring clean-up or recovery steps. Additionally, if coating is to be restricted to only a portion of the substrate surface, some type of masking procedure is necessary.

Moreover, many coating methods expose fluid to an open atmosphere for an extended period of time as well as recirculate and/or reuse fluid that has been already exposed to other substrates. For instance, curtain, dip and roller coating processes all typically expose fluid to an open atmosphere for extended periods; dip coating immerses multiple substrates in the same coating vessel; and a curtain coating process typically recirculates and reuses excess applied fluid.

Such open exposure of fluid and fluid recirculation and reuse gives rise to notable problems. Volatile solvents evaporate from fluid exposed to an open atmosphere. Consequently, either the viscosity of the fluid will vary over time, thus compromising uniformity of the applied coatings, or regular and precise solvent additions must be made throughout the coating process. This latter approach is generally too burdensome for commercial applications, particularly in larger scale operations. Extensive solvent evaporation also poses safety and environmental concerns and requires a suitable venting system. Further, both exposure of fluid to an open atmosphere and fluid reuse results in rapid accumulation of contaminants in the fluid supply. This compromises uniformity of the applied coating and can be entirely unacceptable in many processes. While use of a clean room and scrupulous substrate pre-cleaning can alleviate fluid supply contamination to some degree, such measures are both expensive and burdensome.

Additionally, some coating processes are limited in the range of fluid viscosities that can be satisfactorily applied. For example, to maintain fluid sheet integrity in a curtain coating process, higher viscosity fluids are generally employed. Dip coating provides best results for lower viscosity fluid applications.

These shortcomings of prior coating systems pose significant limitations in the manufacture of many substrates and, more specifically, in the manufacture of printed circuit boards, liquid crystal displays and integrated circuits. Fabrication of these substrates generally requires the application of a highly uniform coating. This demand for coating layer uniformity increases directly with substrate performance requirements. Contamination of fluid supply, viscosity variations arising from solvent evaporation, and other problems of prior coating systems that compromise the integrity and uniformity of the coating layer impose real limits on substrate quality and performance. For example, increased circuit densification is continuously sought; this in turn requires image transfer with maximum resolution. Any irregularities in a photosensitive coating layer generally only serve to reduce resolution. Similarly, higher performance applications require plating processes where plating is strictly limited to specific substrate areas. Decreased resolution of an image patterned on a photosensitive coating can result in migration of a plating solution to substrate areas not intended for plating. Further, photoresists, soldermasks, etchant solutions and other fluids used in the manufacture of printed circuit boards, liquid crystal displays and integrated circuits can be quite expensive. Hence, application of excess fluid or other fluid waste is undesirable.

Another coating method is generally known as "slot coating" in reference to the horizontal, elongate fluid applicator orifice that is typically employed. See, for example, U.S. Pat. Nos. 4,696,885 and 4,938,994, both incorporated herein by reference. It is possible by a slot coating process to apply a generally fixed volume of fluid onto a substrate surface, thus providing advantages of fluid conservation as well as avoidance of excessive fluid dispersion throughout the application area. Further, it is possible by a slot coating process to maintain the fluid in a closed system until deposit of the fluid on a substrate. This overcomes problems of fluid contamination and viscosity variations inherent in "open" type coating systems.

For slot coating on discrete substrates, it may be preferred to apply a separate fluid volume to each substrate; that is, a separate start and stop of fluid flow for each substrate. This is referred to as an intermittent fluid application. While slot coating in general enables control of the width of a coating layer by variation of the length of the slot orifice, intermittent slot coating can further enable control of coating layer length by selectively stopping and/or starting fluid flow within the substrate perimeter. Thus, a perimeter area of the substrate can be left uncoated, enabling ease in handling during subsequent manufacturing steps. Terminating fluid flow just up to or within a substrate perimeter can also avoid fluid accumulation along substrate edges. Such accumulation results in an uneven coating layer. Further, there can be multiple starts and stops of fluid flow within the substrate perimeter, providing selectively coated substrate areas without use of a masking type procedure. Still further, intermittent coating can enable control of coating throughput so to match drying or other processing capacity.

To apply a uniform fluid layer by intermittent coating, a precise start and stop of flow fluid is required for each treated substrate. Dripping of excess fluid after flow termination, however, is a persistent problem. By depositing an excess of fluid on one portion of the coating layer, dripping compromises the layer's uniformity. Dripping of fluid after flow termination can result in several ways. Surface tension adheres fluid to the outer face of the fluid applicator; after flow termination, this fluid will drip onto the substrate surface. Fluid which has traveled past the flow control apparatus into the fluid applicator will also drip onto the substrate after flow has terminated. Further, precise flow cutoffs are particularly difficult with low viscosity fluids, i.e., fluids having a viscosity of less than about 300 centipoise (cps). Specifically, trailing and dripping of fluid after flow termination is common for low viscosity fluids.

For coating multiple substrate sides, prior slot coating processes generally provide positioning a substrate along a horizontal plane and downwardly applying fluid from a fluid applicator directly above the substrate surface; at a later time flipping the substrate to expose an uncoated surface; and then carrying out another fluid application step for the uncoated side. In addition to the time and expense necessitated by such a multiple step procedure, uniformity between coating layers on different substrates sides is compromised. If drying or other fluid layer processing is performed between fluid applications, the first applied coating layer will be exposed to more processing steps than a subsequently coated substrate side. Even if there are no intervening processing steps, the first coated side will be exposed to an open atmosphere longer than subsequently coated sides. Further, conventional double-sided slot coating processes effectively limit the number and type of suitable coating compositions. Compositions that are altered significantly by longer processing or exposure periods are generally unsuitable due to the consequential discontinuities of the coating layers on each substrate side.

SUMMARY OF THE INVENTION

The present invention comprises improved processes and apparatus for slot coating-type fluid applications. The invention provides many advantages, including application of a fixed, non-excess fluid volume onto a substrate; precise control of all dimensions—length, width and thickness—of an applied coating layer; and numerous means to apply a highly uniform fluid layer on a substrate. Other advantages of the invention will be apparent from the description provided herein.

The invention provides a process for uniformly applying a fluid on a discrete substrate comprising providing a fluid reservoir; and flowing fluid from the reservoir without substantial interruption through one or more fluid applicators onto the substrate, the fluid applied with a controlled volume per unit surface area of the substrate, and said fluid flow commencing and terminating to provide a fluid layer on and up to the perimeter of the substrate. By such intermittent application, fluid accumulation along substrate edges and fluid waste are avoided. Fluid flow also may be commenced and terminated so that a uniform coating layer is provided within the perimeter of the discrete substrate, or beyond at least portions of the substrate. Preferably the fluid reservoir is substantially closed to the external environment to avoid fluid contamination as well as evaporation of volatile fluid components prior to application. The substrate may be aligned along any plane, including along a vertical plane or any non-vertical plane such as a horizontal plane. By positioning fluid applicators on different sides of the substrate, more than one substrate side can be coated during the same application cycle. This provides the significant advantages of increasing coating throughput, providing greater uniformity between coating layers on different substrate sides and enabling use of a greater number and type of fluid compositions.

The fluid applicator(s) of the present invention can be spaced from the substrate. The fluid applicator has an opening therethrough for dispensing fluid onto a substrate, preferably an elongate shaped, i.e., slot-shaped, opening. Extending from the applicator opening is an applicator outer face which, preferably, comprises a non-wetting material. The non-wetting material reduces or eliminates accumulation of fluid on the applicator face that might otherwise drip onto the substrate after flow termination, thereby enabling deposit of a highly uniform fluid layer. The fluid applicator also has an inner chamber in communication with a fluid reservoir. For application of low viscosity fluids, i.e. fluids having viscosities less than about 300 cps, at least portions of the walls of the applicator chamber are preferably textured. Such texturing increases the apparent viscosity of fluid flowing through the chamber, thereby substantially reducing trailing and dripping of fluid after flow termination. The fluid applicator also may be in communication with a vacuum to prevent dripping of fluid onto the substrate after fluid flow termination. At about the same time fluid flow is terminated, the vacuum is applied to withdraw traces of fluid within the applicator.

A wide variety of substrates may be coated with a fluid in accordance with the present invention. For example, the substrate may have a non-uniform surface and comprise virtually any material including a dielectric material, glass or metallized glass, a semiconductor material or a conductive material. Similarly, virtually any type of fluid may be applied by the processes of the invention including, for example, a flowable material comprising 100 percent solids, photosensitive compositions such as photoimageable photoresists and soldermask compositions, chemical etchants and resist developer and stripping solutions.

The present invention is generally discussed in terms of applying fluid on a discrete substrate. However, the invention also can be employed for coating what is viewed as a nondiscrete substrate such as a continuous web.

The term "fluid" as used herein means any material capable of being coated onto a substrate and includes a flowable material of 100 percent solids without any type of liquid carrier, a liquid, emulsion or slurry, or any other flowable material.

BRIEF DESCRIPTION OF THE DRAWING

A more complete understanding of the invention may be provided by reference to the accompanying Drawing in which like reference numbers refer to like elements throughout the various figures.

DESCRIPTION OF THE PREFERRED EMBODIMENTS

Figure 1:
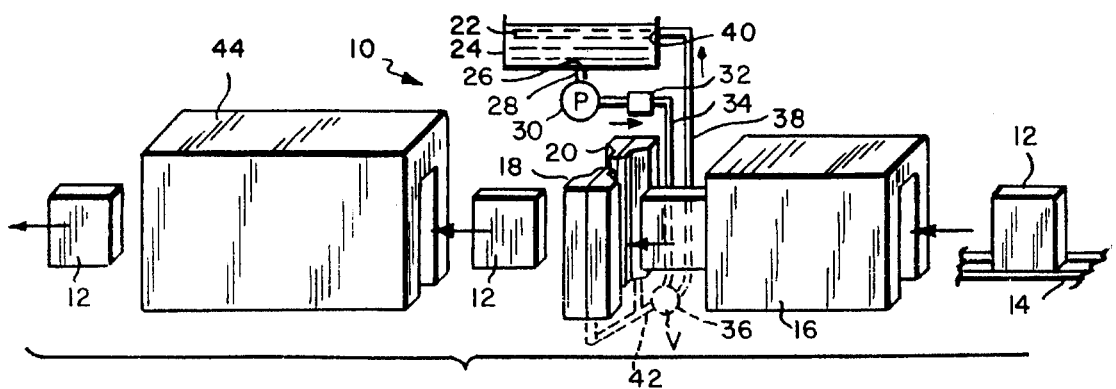
FIG. 1 is a side view of one embodiment of the present invention.

Referring to the Drawing, FIG. 1 depicts coating system 10 as employed for applying fluid substantially simultaneously to multiple sides of a substrate. While portions of the following discussion are in terms of coating multiple substrate sides, the discussion generally is equally pertinent to fluid applications of only a single substrate side. More specifically, for single-sided applications, the only significant change made from system 10 is that one or more fluid applicators are positioned only on one side of the substrate.

Substrate 12 is placed on transport means 14 and transported through system 10. Substrate 12 may be composed of virtually any type of material and be used for virtually any type of application. Suitable transport means 14 may be any of a number of apparatus as is apparent to those skilled in the art. For example, transport means 14 may be an electric rail system wherein the bottom edge of substrate 12 is affixed to one or more rails and the substrate transported thereby throughout the fluid application system. The substrate edge may be affixed to the transport means by a vacuum or by mechanical means. A conveyer belt system is also a suitable transport means, for example the conveyer table identified by the name X-Y and sold by D.C.I. Company of Franklin, Mass.

The substrate may be heated prior to fluid application by heating means 16 to thereby provide a more uniform coating layer, although highly uniform coating layers have been applied without heating the substrate above room temperature. In addition to reducing topography irregularities of the substrate, for instance warp and twist of a printed circuit board, pre-heating provides a more uniform coating by what is believed to be a degassing effect. The substrate may be heated to a temperature within a broad range, preferably between about 35° C. to 70° C. Heating means 16 may be a variety of devices as is apparent to those skilled in the art, for example hot air blowers positioned on opposing sides of substrate 12.

Figure 2:
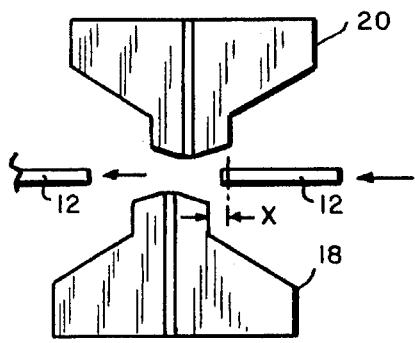
FIG. 2 is a top view showing two fluid applicators employed in accordance with the present invention.

Substrate 12 is then passed through fluid applicators 18 and 20. As the substrate passes through the applicators, the fluid issues under a positive pressure as a connected fluid bead from the fluid applicators and is deposited onto the substrate surface as a uniform layer. For double-sided coating, fluid is preferably applied substantially simultaneously through applicators 18 and 20. As depicted in FIG. 1, substrate 12 is aligned along a substantially vertical plane with fluid to be laterally applied thereon. Applicators 18 and 20 may be offset a distance "x" as shown in FIG. 2, with x generally equal to between about 2 and 5 millimeters. Alternatively, applicators 18 and 20 may not be offset, that is the applicators aligned for their length along the substantially same plane so that the distance x shown in FIG. 2 is zero. Not offsetting the applicators is preferable when fluid "tenting" is desired. Tenting describes the ability of fluid to cover, bridge or span an unsupported substrate area, for example a through-hole of an electronic printed circuit board. See, generally, Coombs, *Printed Circuits Handbook*, p. 11–24 (3d ed., 1988). Fluid tenting is advantageous in many applications; for example, by spanning a through-hole with a resist coating, the through-hole is protected during subsequent etching or other processing steps. By not offsetting applicators 18 and 20, air is trapped within a through-hole during double-coated coating, providing support for the applied fluid and thereby enhancing the fluid's ability to span the orifice. As is known in the art, fluids of higher viscosities and cohesion will provide better tenting properties.

Fluid 22 is contained in vessel 24. The vessel 24 should be constructed of a material resistant to degradation by the fluid. A stainless steel vessel is suitable. If the fluid 22 is susceptible to air oxidation or other degradation, the fluid is preferably stored in vessel 24 under an inert atmosphere, for example an atmosphere of nitrogen or argon. Pump 30 controls the flow rate of the fluid. By action of pump 30, a controlled volume of fluid flows through vessel opening 26 through connecting means 28, pump 30, connecting means 34, valve 36 and connecting means 42 and then through the applicators 18 and 20 onto substrate 12. Also by action of pump 30 fluid can be recirculated through the system back to vessel 24. Pump 30 preferably is a high tolerance metering pump, such as a Zenith brand pump known to those in the art, capable of delivering a unit of fluid to within an accuracy of a tenth of a cubic centimeter. Zenith brand pumps are sold by numerous vendors including Acumeter Laboratories of Marlboro, Mass.

Fluid 22 preferably flows through filter 32 which removes undesired contaminants. Filter 32 either may be positioned after pump 30 as depicted in FIG. 1, or between vessel 24 and pump 30. Suitable filters will vary with the particular fluid circulating through the system. Process filters sold by the Millipore Corporation of Bedford, Mass. are suitable filters for many fluids including photoresist compositions.

Valve 36 controls whether fluid will flow through the fluid applicators onto a substrate or will be recirculated back to vessel 24. That is, fluid flow is commenced and terminated by manipulation of valve 36. Valve 36 may be of a variety of designs. A preferred valve is a two-position poppet valve with a single fluid supply input to the valve assembly. When the two-position valve is placed in the "up" position, fluid flow is commenced and fluid flows into connecting means 42, through applicators 18 and 20 and onto substrate 12 as a connected fluid bead. When the two-position valve is placed in the "down" position, fluid flow into the fluid applicators and onto the substrate is effectively terminated, and fluid flows to connecting means 38 and thereby returns to vessel 24 through opening 40. As should be clear, by commencing and terminating fluid flow at appropriate times as the substrate passes proximately by the one or more fluid applicators, a fluid layer up to, within, or beyond the substrate perimeter can be deposited. Use of valve 36 in general provides sharp, uniform starts and stops of the fluid being deposited on the substrate. A suitable two-position valve is of stainless steel construction and sold by Acumeter Laboratories of Marlboro, Mass. Also, suitable poppet valves are described in U.S. Pat. Nos. 4,891,249 and 4,565,217, both incorporated herein by reference.

Connecting means 28, 34, 38 and 42 may be constructed from a variety of materials as is apparent to those skilled in the art. For example, the connecting means may be standard stainless steel tubing or suitable polymer tubing, such as chloride polyvinyl chloride (CPVC) tubing, or tubing of virtually any other material that is resistant to degradation by the fluid. After application of fluid 22, substrate 12 may be placed in heating means 44 to evaporate volatile solvents or otherwise process the coated substrate. Heating means 44 may be a variety of known apparatus, such as an infrared dryer or a convection oven.

Figure 4:
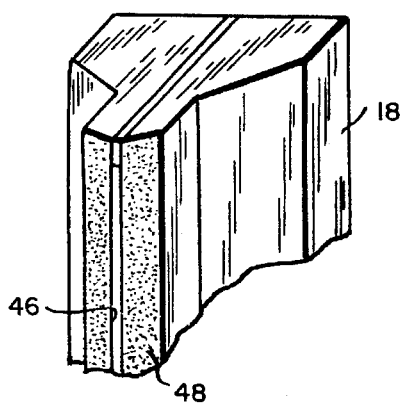
FIG. 4 is a front view of a preferred fluid applicator.

FIG. 4 depicts a preferred fluid applicator having a slot-like opening 46 extending the length of applicator 18. The width of slot opening 46 is generally between about 2 mils and 20 mils and varies within that range depending on the viscosity of the particular fluid being applied. Higher viscosity fluids require a greater width of the slot opening. Thus, for applying a fluid having a viscosity of about 300 cps, the width of opening 46 is suitably between about 2 to 4 mils; for applying a fluid of viscosity of about 10,000 cps, the width of opening 46 is suitably about 5 mils; and for applying a fluid of viscosity of about 40,000 cps, width of opening 46 is suitably between about 10 to 15 mils.

The length of applicator 18 and opening 46 will also vary with application. It should be appreciated that the width of a coating layer can be precisely controlled by the varying the length of opening 46. For applying a fluid on an electronic printed circuit board, a suitable length of applicator 18 is about 24 inches and a suitable length of opening 46 is about 23.5 inches.

Figure 5:
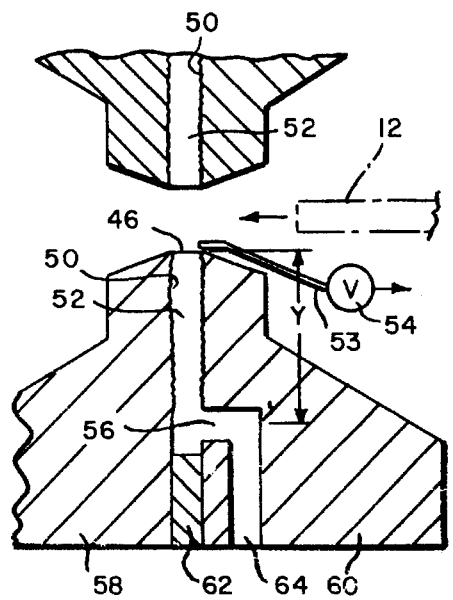
FIG. 5 is a cross sectional view of preferred fluid applicators of the present invention.

Face 48 of applicator 18 extends from the perimeter of opening 46 and preferably tapers away and back from the opening perimeter at a sharp angle as clearly shown in FIGS. 4 and 5. It has been found that regressing applicator face 48 back from the plane of opening 46 provides fluid flow starts and stops of greater precision. In general, face 48 tapers back from opening 46 at a forty-five degree angle, although regressing face 48 at other angles is also suitable. Preferably, the surface of applicator face 48 comprises a non-wetting material. Without the use of a non-wetting material, surface tension tends to cause fluid to collect on the applicator face 48. Consequently, without the use of a non-wetting material on face 48, after fluid flow has been terminated fluid may drip from face 48 onto the substrate resulting in deposit of excess fluid and a non-uniform coating layer. The non-wetting material may be any compound or composition which retards the collection of fluid on applicator face 48. A preferred non-wetting material is the tetrafluoroethylene polymer identified by the trademark of Teflon (E. I. DuPont de Nemours Company), although it is clear that other known non-wetting materials also should provide good results, for example silicone compounds.

For applying fluids of relatively low viscosities, for example fluids of a viscosity of less than about 300 cps, the inner chamber walls 50 of applicator 18 are preferably textured. Chamber walls 50 define applicator chamber 52 through which fluid passes enroute to opening 46. It has been found that suitable roughening of walls 50 creates a drag effect increasing the apparent viscosity of fluid flowing through chamber 52. This gain in apparent viscosity reduces the occurrence of fluid dripping and trailing after flow termination. Chamber walls 50 may be suitably textured by a variety of means including affixing a textured material such as sandpaper thereon as well as suitably abrading the chamber walls, for example sand blasting walls 50.

To avoid dripping or trailing of fluid after flow termination, the fluid applicator preferably is in communication with vacuum 54 as depicted in FIG. 5. At approximately the same time fluid flow is terminated by manipulation of valve 36, a vacuum is applied to the fluid applicator through suitable connective means such as polymer tubing to withdraw traces of fluid within the applicator. Also, the vacuum may be applied at a relatively lower pressure during fluid application to avoid application discontinuities that may be caused by the air boundary layer. For the vacuum system shown in FIG. 5, to withdraw traces of fluid within the fluid applicator after flow termination, a vacuum pressure of about 2.0 to 3.0 inches of water is suitable; and for reducing the effect of the air boundary layer, a vacuum pressure of about 1.0 to 1.5 inches of water is suitable.

As shown in FIG. 5, the vacuum 54 can communicate with chamber 52 by positioning connective means 53 proximately to opening 46, although it is clear that the vacuum could communicate with the fluid applicator by other means. For example, applicator portion 58 can have an orifice through its width in communication with chamber 52 and further in communication with a vacuum source. Such an orifice can be shielded from fluid flow through chamber 52 by placing a suitable separation wall within the chamber.

The vacuum source (e.g., a mechanical vacuum pump) can produce vibrations which, if communicated to the substrate, will result in coating layer irregularities. Thus, a baffling system is preferably used with vacuum 54 to absorb such vibrations. Suitable baffling means can be a variety of systems, including a depth-type tank where at least portions of the vacuum connective means 53 are immersed in a volume of liquid, the liquid dissipating vibrations being communicated from the vacuum source along the connective means.

The distance "y" as shown in FIG. 5, known in the art as the land length, is the distance from applicator reservoir 56 to applicator opening 46. Fluid flows from connecting means 42 through applicator orifice 64 into the applicator reservoir 56 and into chamber 52. The land length must be sufficient to provide laminar flow and a sufficient pressure drop of the fluid and thereby a uniform coating layer. Thus, the land length is preferably greater than one inch and most preferably is between about 1.25 inches and 1.5 inches. With relatively wide coating applications, for example where the length of opening 46 is greater than 50 inches, land lengths of up to 4 inches can be employed.

Figure 6:
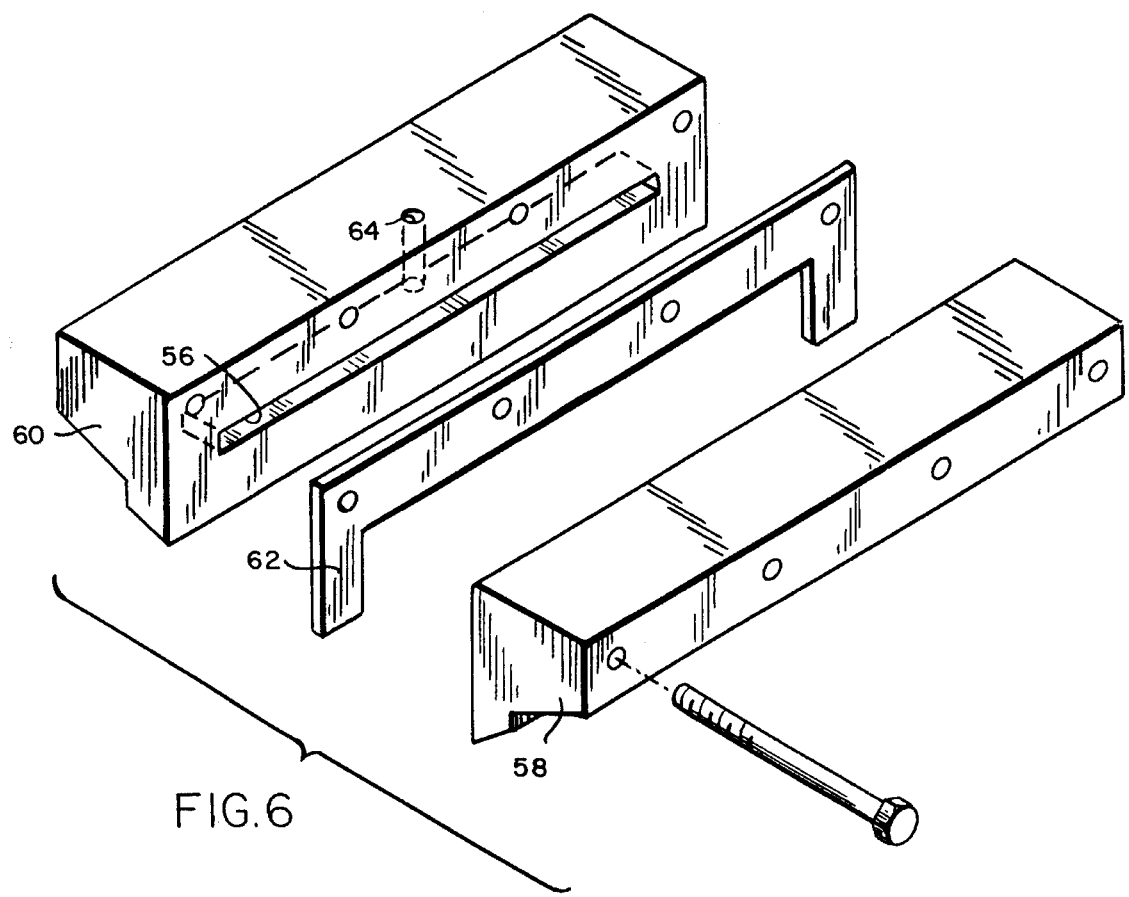
FIG. 6 is an isomeric view of a fluid applicator of the present invention.

A preferred construction of a fluid applicator is shown in FIG. 6. The applicator has first portion 58 and second portion 60 and a shim 62 positioned therebetween. Applicator portions 58 and 60 and shim 62 can be constructed of a variety of materials including hardened steel, stainless steel, aluminum or a suitable polymer. The thickness of shim 62 determines and equals the width of applicator opening 46. Thus, for example, for a width of opening 46 of 5 mils, a shim 62 of 5 mils thickness is employed. Multiple shims, with each shim abutted against another, can also be employed to vary the width of opening 46. Applicator reservoir 56 is generally orthogonally extending relative to the direction of fluid flow from orifice 64 to thereby permit expansion of the fluid along the length of the applicator 18. For a fluid applicator of about 24 inches length, the length of applicator reservoir 56 is about 18 inches with a volume of about 20 cubic centimeters, although the dimensions of applicator reservoir 56 are not believed to be critical provided uniform fluid distribution is realized along the length of the applicator. While the applicator may have greater than one orifice 64 and corresponding reservoir 56, enhanced fluid flow through the applicator is realized through use of a single orifice 64 and reservoir 56. In particular, for low viscosity fluid applications, it has been found that fluid streaking is reduced by employing only one reservoir 56 and a land length of at least one inch. Preferably, orifice 64 is positioned concentrically along the length of reservoir 56 as shown in FIG. 6. During use of applicator 18, first portion 58, second portion 60 and shim 62 are positioned together in tight engagement by any suitable means such as by bolt means as shown in FIG. 6.

A notable advantage of the coating system 10 is that in a preferred aspect fluid flows without substantial interruption from the general reservoir of fluid through the one or more fluid applicators onto the substrate. As should be clear, vessel 24, pump 30, valve 36 and connecting means 26, 34 and 38 in general together comprise a fluid reservoir system, which preferably is substantially closed from the external environment. To provide direct fluid flow to the fluid applicators, valve 36 preferably is positioned in close proximity of the fluid applicator(s). In a preferred system, a three cubic centimeter or less volume exists between valve 36 and one or more fluid applicators. By not placing the fluid in an intermediate vessel between the fluid applicators and the general reservoir system, or otherwise restricting the fluid flow to the applicators and onto the substrate, a simpler and more efficient fluid application system is provided. Additionally, by not restricting direct fluid flow from the general reservoir system to the fluid applicators and onto the substrate, possible layering or other potential discontinuities of the fluid are avoided that could result in a non-uniform coating layer. For high performance applications such as imaging and development of a high resolution photoresist pattern (e.g., development of a line width less than about 2 mils), it can be crucial that the applied photoresist be of a consistent composition throughout the coating layer on the substrate. Any irregularities in the applied photoresist layer can serve to limit resolution of the developed image.

Preferably the entire fluid reservoir is continuously circulated prior to fluid application. After flow termination, i.e. placing valve 36 in the down position, virtually any fluid within the fluid applicators is either deposited onto the substrate or withdrawn from the system by vacuum 54. By circulating the entire reservoir of fluid, layering and potential other fluid discontinuities can be avoided.

The fluid applicators are typically spaced from the substrate, the spacing distance known as the coating gap and measured from the applicator opening 46 to the substrate surface. The coating gap may vary within a broad range with a gap of between about 5 to 20 mils being generally employed. The coating gap may vary within that range depending on factors such as substrate topography. For applying a fluid consisting of 100 percent solids, a smaller coating gap may be preferable, for example a coating gap of about 0.125 mils.

The thickness of the applied fluid layer after drying of any volatiles is equal to the product of the following equation:

$$\frac{(\text{flow rate}) (\text{percent solids}) (\text{specific gravity})}{(\text{coating width}) (\text{coating speed})}$$

In this equation, flow rate, percent solids and specific gravity all refer to the fluid as applied. Coating width is the width of the applied fluid layer and coating speed is the length of coated substrate per unit time. A wide range of dry coating layer thicknesses may be provided by the present invention, including coating layers of dry thickness of between about 1 micron and 150 microns or greater.

As should be clear, by the general means of pump 30 and valve 36, a controlled volume of fluid can be applied per unit surface area of the substrate. Continuous applications also may be made by not terminating fluid flow after coating a single substrate. For continuous applications of discrete substrates, it may be preferable to abut one substrate against another to minimize fluid waste.

Figure 3:
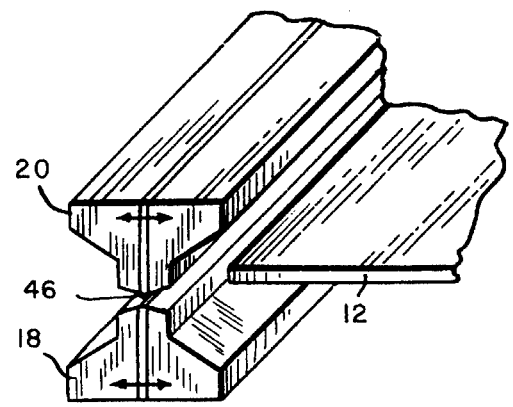
FIG. 3 is an above view showing two fluid applicators employed in accordance with the present invention.

The substrate may be positioned at any angle, including aligned along a vertical plane or any non-vertical plane such as a horizontal plane. Thus the substrate may be positioned above a fluid applicator with fluid flowing upwardly including upwardly in a substantially vertical direction with the substrate aligned along a horizontal plane, as generally depicted in FIG. 3 wherein applicator 18 is shown as positioned for applying fluid upwardly in a substantially vertical direction. Similarly fluid flow may be directly lateral, that is fluid flowing in a horizontal direction, with the substrate aligned a substantially vertical direction as depicted in FIG. 1. By positioning a substrate above an applicator as well as positioning the substrate along a substantially vertical plane, dripping or trailing of fluid on the substrate after flow termination is substantially eliminated thereby enabling application of a highly uniform fluid layer onto a substrate.

When positioning the substrate along a non-horizontal and/or flowing fluid upward onto the substrate, the applied wet fluid can migrate along the substrate surface over time and consequently result in a nonuniform coating layer. To prevent such migration of the applied fluid along the substrate surface, it is necessary to remove any volatiles of the fluid relatively promptly after fluid application and thereby "set" the fluid layer on the substrate surface. Volatile components of the fluid can be removed by heating the substrate with the applied fluid layer thereon by known means such as infrared dryers or a convection oven. The time period within which volatile components of a fluid composition must be removed after application to prevent migration will vary with the angle the substrate is positioned from a horizontal plane as well as the characteristics of the applied fluid, for example the fluid's viscosity, cohesiveness and the wet thickness of the fluid layer. Thus, the smaller the angle of incline of the substrate (and thus the smaller gravitational effect on the applied fluid) and the greater the fluid's viscosity, cohesiveness and the coating layer thickness, migration will occur at a relatively longer time after fluid application. To prevent fluid migration and thereby provide a uniform coating layer, it is generally preferred to commence drying of the fluid layer within about one minute after application of the fluid onto the substrate, and to complete removal of the fluid's volatile components within about five minutes of fluid application. As should be clear however, depending on the above noted factors of substrate position and characteristics of the particular fluid being applied, commencing drying later than one minute after fluid application may be satisfactory, or it may be necessary to commence removal of the volatile components sooner than one minute after fluid application. Also, pre-heating of the substrate by heating means 16 as described above can inhibit any potential fluid migration by enhancing the rate of evaporation of volatile fluid components.

Many variations from the above described system are within the scope of the invention. Thus, as generally depicted in FIG. 3, rather than employing transport means 14, substrate 12 may remain stationary with applicators 18 and 20 moving laterally relative to substrate 12. After fluid application, substrate 12 may be removed and another substrate placed between the applicators.

Further, multiple fluid applicators may be positioned on each side of a substrate, with each fluid applicator connected to a separate fluid reservoir. This can enable application of different fluid compositions onto different substrate sides; application of different fluid compositions onto substrates passing consecutively through the coating system; or coating multiple fluid layers per single pass of a substrate through the coating system. Thus, multiple layers can be applied successively on top of previously applied layers without a drying step between each layer application. The layers will stay separate and distinct for a time period that varies with fluid viscosity and cohesiveness as well as the thickness of each coating layer. Hence, fluid migration between the coating layers can be prevented by removing volatiles or otherwise "setting" the coating layers promptly after fluid application.

Virtually any type of fluid of virtually any viscosity may be applied onto a substrate in accordance with the invention including photoresist and soldermask compositions, chemical developer and stripper solutions for photoresist compositions, chemical etchant solutions, and permanent dielectric coatings such as a permanent soldermask composition. Such fluids are described in Coombs, *Printed Circuits Handbook* (3d ed., 1988). Similarly, virtually any type of substrate may be coated with fluid in accordance with the invention including dielectric substrates such as polymeric and ceramic substrates used in electronics applications; conductive substrates such as a metallic sheet from which a substrate can be chemically etched, or a printed circuit board precursor such as a copper clad laminate; and substrates used as liquid crystal displays such as glass or metallized glass substrates. Also suitable are substrates useful in the printing industry such as aluminum substrates that can be used as relief plates as well as substrates that can be used as name plates (e.g., a name plate affixed to a product to provide identification thereof). Name plates are commonly formed from an anodized aluminum substrate through application and processing of a photoresist composition.

The processes of the invention also provide uniform fluid applications on nonuniform surfaces such as a printed circuit board having through-holes and/or circuit traces thereon.

As noted the present invention is advantageously employed in the manufacture of a wide variety of products and is particularly well suited for the manufacture of printed circuit boards, liquid crystal displays and integrated electronic circuits. Printed circuit board manufacture requires the application of numerous fluids onto a board surface such as photoresist compositions, resist developer and stripper solutions, etchant solutions and both temporary and permanent soldermask compositions. It is often preferable to coat a photoresist within the board perimeter leaving an uncoated border area that is convenient for manipulation of the board during subsequent processing steps. Also, to compensate for circuit board warp and twist which can comprise uniformity of a coating layer, a nip roller is preferably used. The nip roller traverses the board surface just ahead (e.g., 0.125 inches) of the fluid applicator and contacts the board with force sufficient to provide a more uniform, i.e., level, substrate surface. For substrates of widths greater than about 24 inches, use of multiple smaller width nip rollers is generally preferred.

Liquid crystal display (LCD) manufacture requires applying a uniform fluid layer (e.g., a photoresist layer) of a dry thickness as small as about 2 to 3 microns on a suitable substrate such as substrate comprising glass or metallized glass. Spin coating has been the traditional fluid application method for LCD manufacture. However, this method has several shortcomings, including application of an excess of fluid as well as fluid accumulation along substrate edges and corners. It has been found the present invention is well suited for LCD applications as it overcomes such problems of the prior art and enables deposit of a highly uniform fluid layer on a glass or other suitable substrate, the fluid layer having a dry thickness of 2 to 3 microns. Specifically, in one application sequence for the fabrication of a liquid crystal display, a photoresist composition of about 30 percent solids and having a viscosity of about 300 cps was applied as a wet film thickness of about 7 microns on a glass substrate to provide a dry film thickness of approximately 3 microns. No significant migration of the wet coating layer was observed, and a highly uniform dry coating layer was provided.

As the present invention enables the application of a highly uniform coating layer, it is also well suited for the manufacture of dry film photoresists. A dry film resist is typically produced by coating a photopolymerizable resist composition onto a suitable support such as a polyolefin film and then covering the resist with a thin polymer film, for example a polyester film. The thin film is peeled away prior to use and the solid resist layer applied to a substrate surface. See, generally, W. S. DeForest, *Photoresist Materials and Processes*, pp. 163–212 (McGraw Hill 1975), incorporated herein by reference.

The foregoing description of the present invention is merely illustrative thereof, and it is understood that variations and modifications can be effected without departing from the spirit or scope of the invention as set forth in the following claims.

What is claimed is:

1. A process for applying a fluid layer on a discrete substrate comprising the steps of:
   (a) providing a fluid reservoir containing a fluid having a controlled volatile component content, said fluid reservoir fluidly coupled with one or more fluid applicators by a valve member, each of said one or more fluid applicators having an elongate-shaped opening, and at least one of said one or more fluid applicators having walls within the applicator defining a chamber, said walls having at least some portions roughened in an amount sufficient to substantially reduce dripping or trailing of fluid after termination of fluid flow from the one or more fluid applicators;
   (b) at least primarily by manipulating the valve member, commencing a flow of the fluid without substantial interruption from the fluid reservoir through the elongate-shaped opening of the one or more fluid applicators onto the discrete substrate while relatively moving the discrete substrate and the one or more fluid applicators with respect to one another such that a fluid layer is applied on the substrate surface, the fluid applied with a controlled volume per unit surface area of the substrate.

2. The process of claim 1 where fluid flow is commenced and terminated to provide a fluid layer within the substrate perimeter.

3. The process of claim 1 where the fluid reservoir is a substantially closed system.

4. The process of claim 1 where the fluid is continuously circulated in the fluid reservoir prior to application of the fluid on the substrate.

5. The process of claim 1 where at least one of the one or more fluid applicators has an opening and an outer face extending from the opening, the surface of the applicator outer face comprising a non-wetting material.

6. The process of claim 5 where the non-wetting material is selected from the group consisting of a silicone compound and Teflon.

7. The process of claim 5 where the applicator outer face regresses back from the applicator opening.

8. The process of claim 1 where the one or more fluid applicators are spaced from the substrate.

9. The process of claim 1 where the substrate is positioned above the one or more fluid applicators and the fluid upwardly flows onto the substrate.

10. The process of claim 9 where the fluid upwardly flows in a substantially vertical direction.

11. The process of claim 1 where the substrate is positioned along a substantially vertical plane, and the fluid flows from the one or more fluid applicators laterally onto the substrate.

12. The process of claim 1 where at least two fluid applicators are provided, the substrate being positioned between the fluid applicators wherein at least one applicator faces a first side of the substrate and at least one applicator faces a second side of the substrate, and fluid flows through the fluid applicators at least substantially simultaneously onto each of the first and second sides of the substrate.

13. The process of claim 12 where the first and second substrate sides are opposing sides of the substrate.

14. The process of claim 13 where the substrate is a printed circuit board having through-holes; a first fluid applicator having a slot-shaped opening faces one side of the circuit board and a second fluid applicator having a slot-shaped opening faces a second side of the circuit board, the first and second circuit board sides being opposing sides of the circuit board.

15. The process of claim 14 where the first and second fluid applicators and the slot-shaped openings thereof are aligned along the substantially same plane and fluid flows substantially simultaneously through each of the slot-shaped openings of the fluid applicators onto the first and second circuit board sides.

16. The process of claim 12 where the first and second sides of the substrate are aligned along a substantially horizontal plane.

17. The process of claim 12 where the first and second sides of the substrate are aligned along a non-horizontal plane.

18. The process of claim 12 where the first and second sides of the substrate are aligned along a substantially vertical plane.

19. The process of claim 1 where fluid is applied to a layer thickness of between about 1 and 150 microns.

20. The process of claim 1 where the substrate has a non-uniform surface.

21. The process of claim 1 where at least portion of the discrete substrate is comprised of one or more materials selected from the group consisting of a dielectric material, a conductive material, and a semiconductive material.

22. The process of claim 1 where the fluid comprises a photosensitive composition.

23. The process of claim 1 where the fluid is selected from the group consisting of a photoresist composition, a solder-mask composition, a permanent dielectric coating, a chemical etchant, a chemical developer solution, and a chemical stripping solution.

24. The process of claim 1 further comprising applying a vacuum to within one or more fluid applicators at approximately the same time fluid flow is terminated, said vacuum being of a pressure sufficient to withdraw fluid within the fluid applicator.

25. The process of claim 1 of further comprising the step of applying a vacuum proximately to the one or more fluid applicators whereby the effect of the air boundary layer on the fluid being applied on the substrate is reduced.

26. The process of claim 1 where said fluid flow is commenced and terminated to provide a fluid layer up to the perimeter of the substrate.

27. The process of claim 26 where said fluid flow is commenced and terminated by means of intermittent flow of fluid from the fluid reservoir to the fluid applicators.

28. The process of claim 1 where the fluid is applied to the substrate as a connected fluid bead.

29. The process of claim 1 where the discrete substrate is selected from the group consisting of a printed circuit board substrate, an integrated circuit substrate, a relief plate substrate and a name plate substrate.

30. The process of claim 1 where a three cubic centimeter or less volume exists between the valve member and the one or more fluid applicators.

31. The process of claim 1 wherein a valve member is manipulated to commence the flow of fluid directly from the fluid reservoir through the elongate-shaped opening of the one or more fluid applicators and without the fluid flowing through an intermediate chamber positioned between the fluid reservoir and the one or more fluid applicators.

32. The process of claim 1 wherein the valve member is positioned proximate to the elongate-shaped openings of the one or more fluid applicators.

33. The process of claim 1 wherein the flow of fluid is commenced without use of a displacement rod.

34. A process for applying a fluid layer on a liquid crystal display substrate, said process comprising the steps of:
   (a) providing a fluid reservoir containing a fluid having a controlled volatile component content, said fluid reservoir fluidly coupled with one or more fluid applicators, and at least one of said one or more fluid applicators having walls within the applicator defining a chamber, said walls having at least some portions roughened in an amount sufficient to substantially reduce dripping or trailing of fluid after termination of fluid flow from the one or more fluid applicators;
   (b) flowing the fluid from the fluid reservoir through one or more fluid applicators onto the liquid crystal display substrate, the fluid applied in a controlled volume per unit surface area of the liquid crystal display substrate.

35. The process of claim 34 where said fluid flow is commenced and terminated to provide a fluid layer up to a perimeter of the liquid crystal display substrate.

36. The process of claim 35 where said fluid flow is commenced and terminated at least primarily by a valve member.

37. The process of claim 34 where said fluid flow is commenced and terminated to provide a fluid layer within a liquid crystal display parameter.

38. The process of claim 34 further comprising applying a vacuum to within one or more fluid applicators at approximately the same time fluid flow is terminated to withdraw fluid within the fluid applicator.

39. The process of claim 34 where the fluid is applied to the liquid crystal display substrate as a connected fluid bead.

40. The process of claim 34 where the one or more fluid applicators are spaced from the liquid crystal display substrate.

41. The process of claim 34 where at least one of the one or more fluid applicators has an opening and an outer face extending from the opening, and wherein the surface of the applicator outer face comprises a non-wetting material.

42. The process of claim 34 where each of the one or more fluid applicators has an elongate-shaped opening and fluid flows from the fluid reservoir through the elongate-shaped opening of the one or more fluid applicators onto the liquid crystal display substrate.

43. The process of claim 42 where the liquid crystal display substrate and the one or more fluid applicators are relatively moved with respect to one another while fluid flows through said elongate-shaped opening to thereby apply a fluid layer on the liquid crystal display substrate.

44. A process for applying a fluid on a discrete substrate, said process comprising the steps of:

(a) providing a fluid reservoir fluidly coupled to one or more fluid applicators, each of the one or more fluid applicators having an elongate-shaped opening and at least one of the one or more fluid applicators having walls, said walls within the applicator defining a chamber, said walls having at least some portions roughened in an amount sufficient to substantially reduce dripping or trailing of fluid that could occur after termination of fluid flow from the one or more fluid applicators;

(b) flowing the fluid from the fluid reservoir through the elongate-shaped opening of the one or more fluid applicators onto the substrate to apply a uniform fluid layer thereon;

(c) terminating flow of the fluid whereby an occurrence of fluid dripping and trailing after flow termination is reduced as a result of said roughened portions, and the fluid is applied with a controlled volume per unit surface area of the substrate.

45. The process of claim 44 where the fluid has a viscosity of less than about 300 cps.

* * * * *